United States Patent [19]

Macovski

[11] Patent Number: 4,665,366
[45] Date of Patent: May 12, 1987

[54] NMR IMAGING SYSTEM USING PHASE-SHIFTED SIGNALS

[76] Inventor: Albert Macovski, 2505 Alpine Rd., Menlo Park, Calif. 94025

[21] Appl. No.: 710,484

[22] Filed: Mar. 11, 1985

[51] Int. Cl.⁴ ............................................. G01R 33/20
[52] U.S. Cl. ..................................... 324/309; 324/307
[58] Field of Search ............... 324/300, 307, 309, 310, 324/312

[56] References Cited

U.S. PATENT DOCUMENTS

| | | | |
|---|---|---|---|
| 4,307,343 | 12/1981 | Likes | 324/309 |
| 4,318,043 | 3/1982 | Crooks | 324/309 |
| 4,475,084 | 10/1984 | Moore | 324/309 |
| 4,528,985 | 7/1985 | Macovski | 324/309 |

Primary Examiner—Michael J. Tokar
Attorney, Agent, or Firm—Flehr, Hohbach, Test, Albritton & Herbert

[57] ABSTRACT

The nuclei in a volume are imaged using a sequence of excitations in the presence of one or more time-varying gradient fields. The resultant phase variations are cancelled to isolate a region of the volume. Various phase-modulation functions are used to provide a desired localization function. The excitation variations can be combined with time-varying gradients during the reception interval.

23 Claims, 8 Drawing Figures

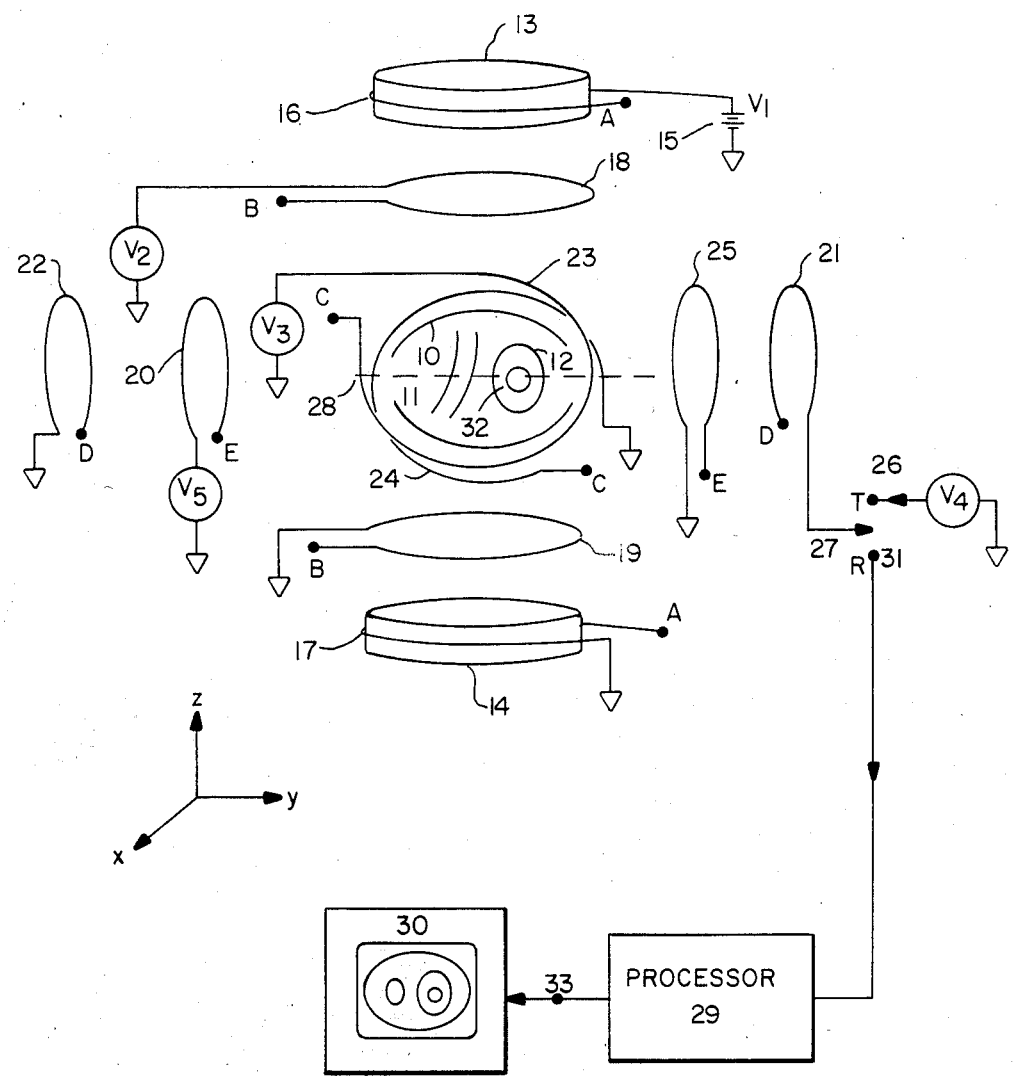
FIG.—1

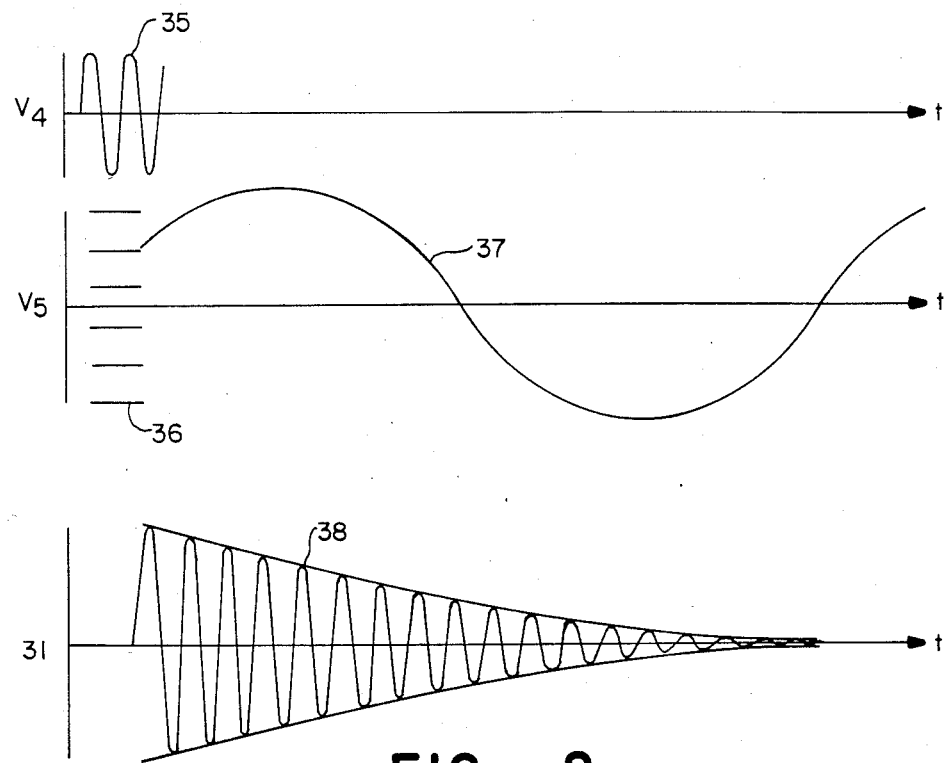
FIG.—2
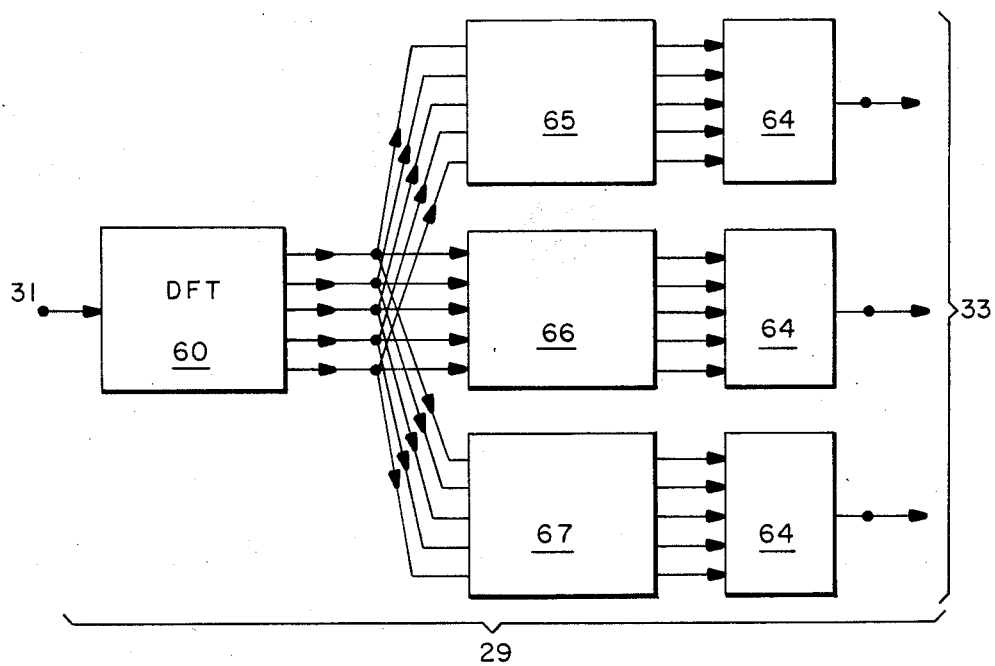
FIG.—5

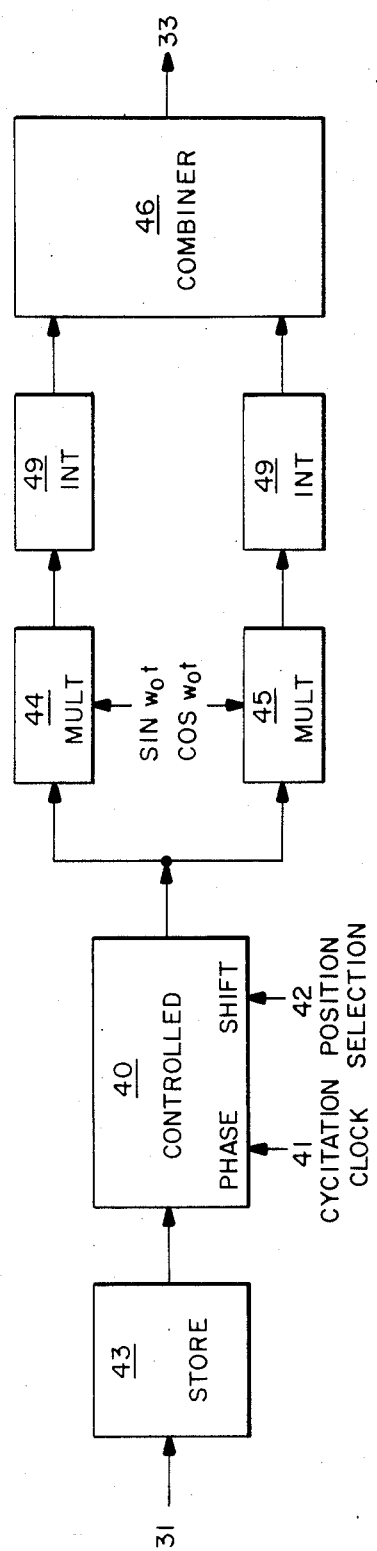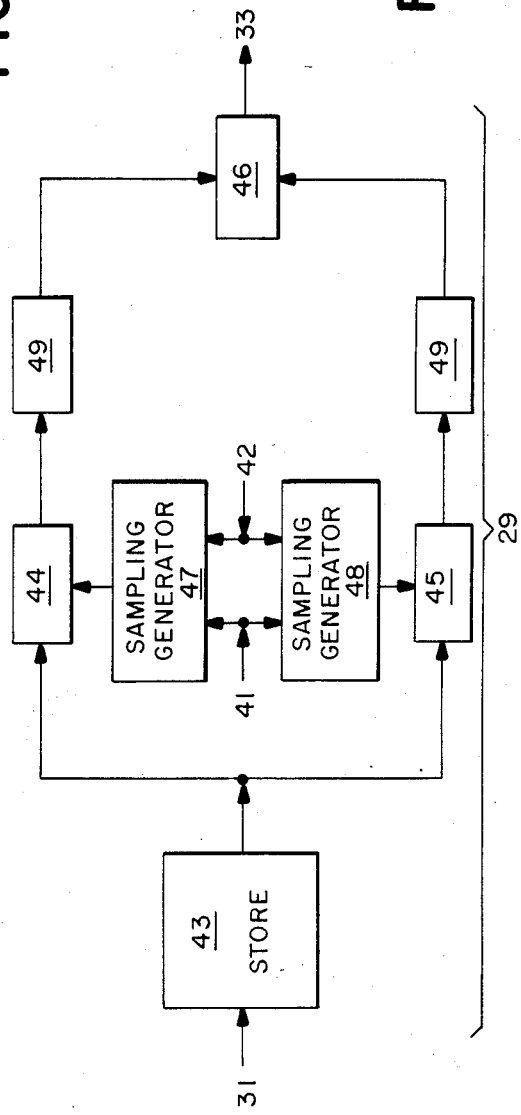
FIG.—3a
FIG.—3b

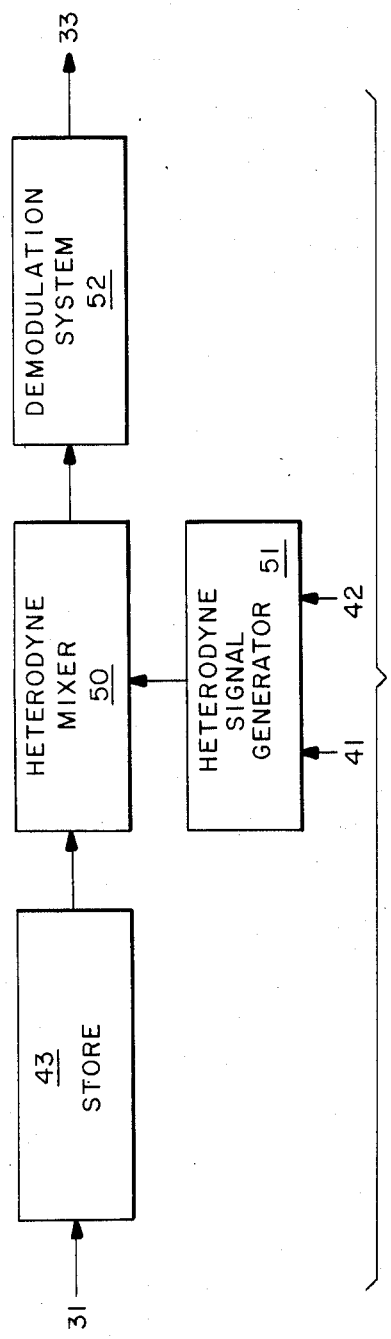
FIG.—3c
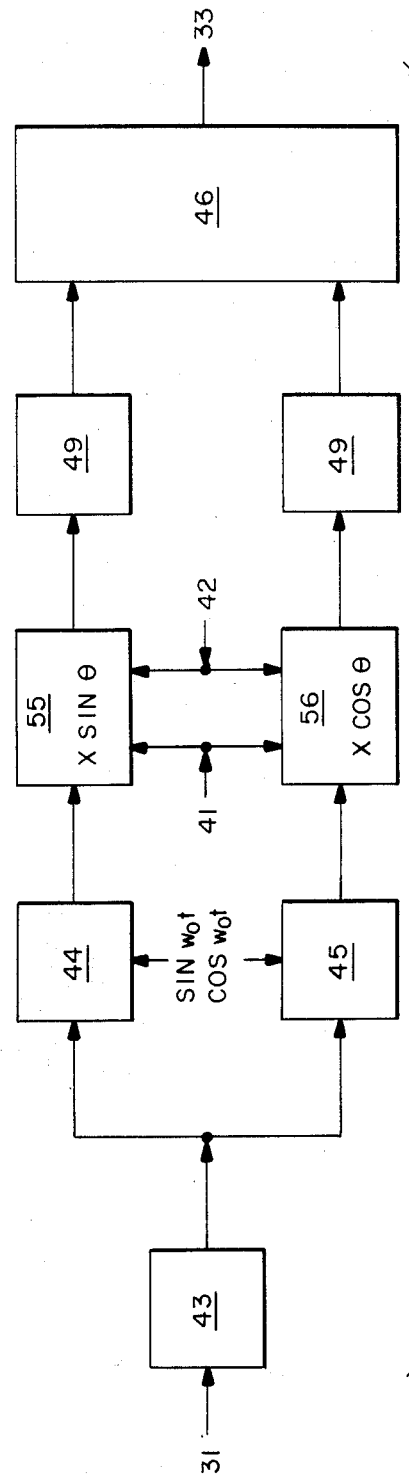
FIG.—3d

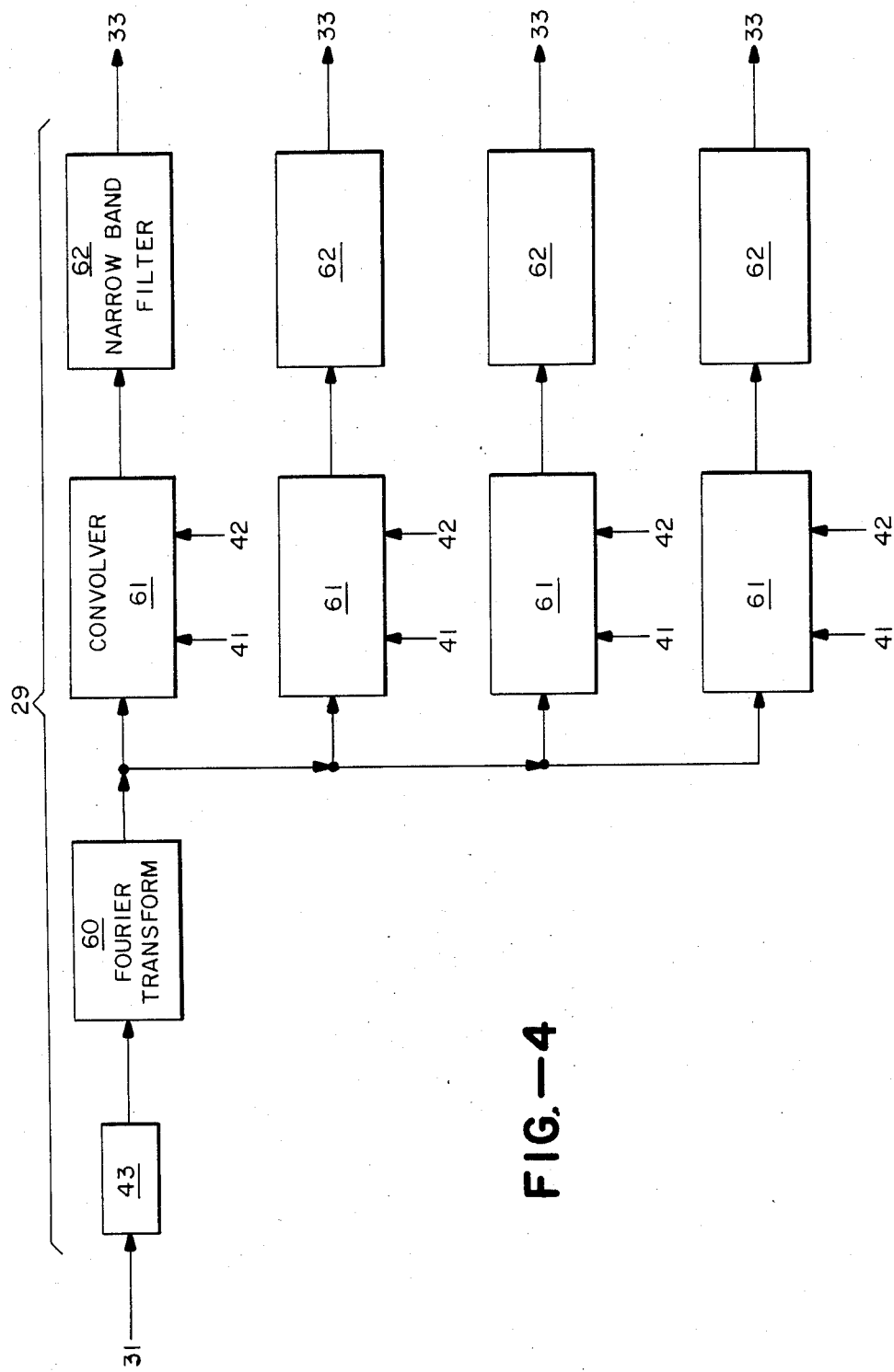
FIG.—4

NMR IMAGING SYSTEM USING PHASE-SHIFTED SIGNALS

BACKGROUND OF THE INVENTION

1. Field of the Invention

This invention relates to NMR imaging. In a primary application it relates to defining the NMR parameters of all regions of a volume through simultaneous data acquisition.

2. Description of Prior Art

In recent years significant attention has been focused onto the problem of NMR imaging. Here the fundamental problem is that of spatial localization where various NMR parameters are measured at specific local regions within a volume. One of the most significant contributions to the localization problem was the sensitive-point method of Waldo S. Hinshaw. This is described in a paper by Hinshaw entitled, "Image Formation by Nuclear Magnetic Resonance: The Sensitive-Point Method," in the *Journal of Applied Physics*, Vol. 47, pp. 3709–3721, August 1967 and in British Pat. No. 1,508,438 and U.S. Pat. No. 4,015,196 issued to W. S. Moore and W. S. Hinshaw.

The fundamental method involves the use of time-varying or a.c. gradient fields. In its simplest embodiment a.c. gradient fields of different frequencies are applied to all three axes. The demodulated signal is then integrated so that all temporal variations are removed. The resultant integrated signal is therefore sensitive only to the null region of the various gradient fields. One point in space, corresponding to the null of all three a.c. gradient fields, provides an integrated output signal. To provide an image, the a.c. gradient fields are altered to move the null point. This method is effective, but slow, since one point at a time is acquired, and each point requires significant integration time.

It is interesting to note that, in British Pat. No. 1,508,438 the inventors indicate that each point in the volume experiences a unique time dependency which is distinguishable from signals produced by other points in the volume. However, in all published material to this date, no method has been shown for studying any point other than the null point; thus making the method effective, but very slow. Its unusually slow speed has kept it from use in generalized image applications where other methods have been dominant. Its only present day use has been that of localized spectrometry where the NMR spectrum of any desired local region can be studied. One example of this is in a paper by Katherine N. Scott, et al. entitled, "Spatial Localization of $^{31}P$ Nuclear Magnetic Resonance Signal by the Sensitive Point Method," appearing in the *Journal of Magnetic Resonance*, Vol. 50, pp. 339–344, 1982.

As previously indicated, the use of three a.c. gradient signals followed by integration isolates a specific point. Similarly, two a.c. gradients isolate a line and one a.c. gradient isolates a plane, using the same null phenomenon. The use of lines or planes can be part of various combined imaging systems such as those involving reconstruction from projections. In addition, it should be pointed out that two of the a.c. gradient fields can be of the same frequency but shifted by 90° in phase, providing the required orthogonality. An interesting variation on the sensitive point method is described in British Pat. No. 1,601,816 invented by Waldo S. Hinshaw where a line array of points are acquired simultaneously. Here a.c. gradients, such as two orthogonal sinusoids, are applied to two axes with a static gradient on the third axis. The filtering of the a.c. signals limits the acquisition to the line defined by the intersection of the null planes. However, due to the static gradient, each point along the null line represents a different frequency. Thus Fourier transformation of the filtered signal provides simultaneous information about points along the null line. However, no method is shown of studying the activity of points in other lines other than changing the a.c. gradients and decomposing a new line, with its attendant problems of long acquisition times.

One method, however, does provide for the simultaneous acquisition of data of points within a plane. This method, known as the echo planar system is described in a paper by P. Mansfield and I. L. Pykett in the *Journal of Magnetic Resonance*, vol. 29, p. 355, 1978. It is also described in the book by P. Mansfield and P. G. Morris *NMR Imaging in Biomedicine*, Academic Press, 1982. In this method an xy plane is excited and, while the resultant signals are received, a static gradient is applied in the x dimension and a square wave gradient in the y dimension. The square wave gradient essentially involves amplitude modulation of each region at a frequency based on its y position. Because of the periodic modulation, discrete regions along ȳ are received each representing a different frequency. These discrete y positions are superimposed on a continuous frequency spectrum representing the x coordinates due to the static gradient. Thus each frequency represents a spatial position with all of the spatial information acquired simultaneously.

This system has a number of problems. Firstly, the modulation technique, resulting in discrete frequencies, limits the data acquisition to discrete positions in the y dimension rather than the desired ability to access all regions. This modulation technique also limits the matrix size or system resolution as pointed out by Mansfield. Also, although in theory the method is applicable to acquiring all three dimensions simultaneously by using an additional modulated z gradient, this would result in severe spectral complexity and has yet to be attempted as far as published literature is concerned.

The limitation of the technique essentially lies in the fact that each spatial position is represented by a specific region of the frequency spectrum of the signal.

A variation on the echo planar system was described in a paper by M. M. Tropper in the *Journal of Magnetic Resonance*, vol. 42, pp. 193–202, 1981 entitled "Image Reconstruction for the NMR Echo-Planar Technique, and for a Proposed Adaptation to Allow Continuous Data Acquisition." As with the echo planar system, data is acquired from a single plane using one static and one time-varying varying gradient during the receiving time. The signal processing, however, makes more efficient use of the signal. The specific processing system shown, however, is quite complex in that it involves a unique sampling sequence followed by a Fourier transform for each image point. It does, however, provide improved performance over the original echo planar method. The paper does not discuss simultaneous acquisition of information from the entire volume.

The first method of efficient simultaneous imaging of NMR parameters of an entire volume, by the same inventor, is in U.S. application Ser. No. 499,218 filed May 31, 1983 followed by continuation application Ser. No. 603,333 filed Apr. 24, 1984 U.S. Pat. No. 4,639,671 entitled "Simultaneous NMR Imaging System." Here time-varying gradients are used during the times that signals are received. These signals are processed to enable the determination of various NMR parameters at any desired region.

SUMMARY OF THE INVENTION

An object of this invention is to simultaneously acquire information on the NMR activity of a plurality of points in a region.

A further object of this invention is the high-speed acquisition of information on NMR activity to avoid the affects of motion.

A further object of this invention is the simultaneous acquisition of NMR spectroscopic data from a number of points in a region.

A further object of this invention is the simultaneous acquisition of flow data from a number of points in a region.

A further object of this invention is to obtain NMR data with relative immunity to inhomogeneity of the main magnetic field and immunity to chemical shift.

Briefly, in accordance with the invention, one or more time-varying a.c. gradient fields are used during the rf excitation interval. The received signals are effectively phase shifted to isolate a desired region. Additional phase modulation functions can be used to provide improved localization. The excitation variation can be combined with time-varying gradients during the reception interval. NMR parameters including the spectrum, density, relaxation times or flow can be extracted.

BRIEF DESCRIPTION OF THE DRAWINGS

For a more complete disclosure of the invention, reference may be made to the following detailed description of several illustrative embodiments thereof which is given in conjunction with the accompanying drawings, of which:

FIG. 1 is a schematic representation of an embodiment of the invention;

FIG. 2 is a set of representative waveforms of an embodiment of the invention;

FIG. 3a is an embodiment of the processing system using a controlled phase shifter;

FIG. 3b is an embodiment of the processing system using controlled sampling generators;

FIG. 3c is an embodiment of the processing system using a controlled heterodyne signal generator;

FIG. 3d is an embodiment of the processing system using $\sin \theta$ and $\cos \theta$ multipliers;

FIG. 4 is an embodiment of the processing system operating in the frequency domain; and FIG. 5 is an alternate embodiment of the processing system operating in the frequency domain.

DESCRIPTION OF THE PREFERRED EMBODIMENT

An understanding of the broad aspects of the invention may best be had by reference to FIG. 1 where the NMR parameters of object 10 are imaged. In general, the principal axial magnetic field is produced using, for example, pole pieces 13 and 14 excited by coils 16 and 17. These are driven by d.c. source $V_1$ with the coils 16 and 17 producing fields in the same direction to create a substantially uniform field throughout the region of interest in volume 10. This is by far the strongest field in the system with a strength of the order of one to ten kilogauss. With both this coil and the remaining coils, the letter pairs A-E are simply convenient ways of indicating connections.

Specific regions are selected using the gradient coils. Coils 18 and 19 form a gradient field in the z direction driven by source $V_2$. Similarly coils 23 and 24 are on opposite sides of object 10 and thus form a gradient field in the x direction driven by source $V_3$ with coils 20 and 25 forming a y gradient field driven by source $V_5$. Unlike coils 16 and 17 which create a uniform field, these gradient coils are bucking each other so as to produce a varying field in the respective direction.

Coils 21 and 22 are the radio frequency coils serving both the transmitter and receiver function. They produce fields in the same direction to create a substantially uniform field in volume 10. When switch 27 is in the transmit position, 26, generator $V_4$, is used to excite the magnetic spins in volume 10. When switch 27 is connected to the receive position, signal 31 is received from magnetic spin signals in volume 10. These are processed in processor 29 to provide various images of NMR parameters which are displayed in display 30.

Although a single rf coil system, 21 and 22, is shown for both transmit and receive, many instruments, for convenience, use separate transmit and receive coils to minimize the coupling, following the transmitter burst. In those cases clearly the transmitter coils would be permanently connected to terminal 26 and driven by $V_4$ while the receiver coils would be permanently connected to 31, feeding signal processor 29. In systems using separate sets of coils it is often useful to have their respective axes in quadrature, to minimize coupling, with both axes perpendicular to the z axes. Thus, if a separate set of receiver coils are added, they would be parallel to gradient coils 23 and 24.

A variety of combinations of excitation signals $V_4$, gradient signals $V_2$, $V_3$ and $V_5$, and processing systems 29 can be used to study specific parameters and regions of volume 10.

When a gradient is present during an excitation interval $\tau$, each region experiences a phase shift with respect to the null region given approximately by $$\theta = \gamma \int_0^\tau \widetilde{G}(t) \cdot \vec{r} \, dt$$

For example, with a gradient $G_x$ in the x direction, which is constant during the excitation interval, the phase shift is given by $$\theta \simeq \gamma \tau G_x x$$

In this invention, this starting phase shift is used as a mechanism for spatial localization, either by itself, or in combination with time-varying gradients during the receive interval. We first consider the case of a time-varying gradient, during the excitation interval. For simplicity we initially consider a single dimension. A series of short excitation bursts are used, have a duration $\tau$ and a periodicity T. During the excitation interval a gradient signal $G_x(t)$ is applied. For convenience we assume that $G_x(t)$ is approximately constant during each short excitation interval $\tau$. The resultant received signal from each point, following synchronous demodulation, is given by $$v(t) = \sum_{n=0}^{N-1} e^{i\theta_n} e^{-(t-nT)/T_2} \mathrm{rect} \frac{t - \frac{T}{2} - nT}{T}$$

where $\theta_n = \gamma\tau G_x(nT)x$ and where the rect function is unity from T to (n+1)T and zero. If v(t) is integrated over N periods, where N is sufficiently large, v(t) will average to zero for all values of x except those close to zero, because the phase is varying over the entire $2\pi$ range. Thus $$\int_0^{NT} v(t)dt = s(x)$$

where s(x) is the localization or point spread function. This is somewhat the equivalent of the sensitive point method with the important distinction that the variation is occurred during the excitation, not the reception.

To focus on any desired point, rather than simply the origin, prior to integration we multiply v(t) by a processing phase function which cancels the excitation phase function at a particular point in space. For example, at each time nT, we multiply v(t) by $\exp[-i\gamma\tau G_x(nT)a]$ with the resultant integrated signal given by $$\int_0^{NT} v(t) \sum_{n=0}^{N-1} \exp[-i\gamma\tau G_x(nT)a]\mathrm{rect}\frac{t-\frac{T}{2}-nT}{T} dt =$$

$$s(x-a)$$

This formulation is readily seen since, only at x=a is the argument of the phase function zero. In this way, with a given data acquisition, any desired point can be selected by processing the same signal v(t).

As an important example, assume a sinusoidal gradient where $G_x(t) = G \sin \omega t$. The integrated received signal is given by $$\int_0^{NT} v(t)dt =$$

$$\int_0^{NT} \sum_{n=0}^{N-1} \exp[i\gamma\tau Gx\sin(\omega nT)] e^{-(t-nT)/T_2} \mathrm{rect}\frac{t-\frac{T}{2}-nT}{T} dt$$

We use the Bessel function identify $$\exp[i\alpha x \sin\omega(nT)] = \sum_l J_l(\alpha x) e^{il n\omega T}$$

where $\alpha = \gamma\tau G$. Substituting we obtain $$\int v(t)dt = \sum_l J_l(\alpha x)\int \sum_{n=0}^{N-1} e^{il n\omega T} e^{-(t-nT)/T_2}\mathrm{rect}\frac{t-\frac{T}{2}-nT}{T} dt$$

Here we have the integral of a positive repetitive function, with each period of the function modified by a phase factor $ln\omega T$. As long as N is sufficiently large, and $\omega T$ is not a multiple of $\pi$, the integral will be approximately zero unless l=0. Therefore the localization function is $$\int_0^{NT} v(t)dt = NJ_0(\alpha x).$$

As before, prior to integration we multiply each period of v(t) by $\exp[-i\alpha a \sin(\omega nT)]$. Following integration we obtain $NJ_0[\alpha(x-a)]$, thus moving the localization function to x=a.

For many applications the $J_0(.)$ localization function will prove undesirable because of its large side lobes. The function can be significantly changed by additionally multiplying each period of v(t) by $e^{-ipn\omega T}$ resulting in a localizing function $J_p(\alpha x)$. Using appropriate values of p, any Bessel order can be isolated. In particular we consider the identity $2J_1(x)/x = J_0(x) + J_2(x)$. Here a desired "jinc" localization function is derived from the sum of two others. Thus, if each period of v(t) is multiplied by $(1 + e^{-i2n\omega T})$, the resultant integrated localization function will be $J_1(\alpha x)/\alpha x$. As before, this can be applied to any point. Other Bessel functions can be used to provide other desired localization functions.

We have thus far shown a method of localization in one dimension using a time-varying gradient during a sequence of excitation intervals. This can be done in two or more dimensions by simultaneously applying gradients in all dimensions where $\theta_n$ is given by $$\theta_n = \gamma\tau \widetilde{G}(t) \cdot \widetilde{r}$$

$$= \gamma\tau[G_x(nT)x + G_y(nT)y + G_z(nT)z]$$

To ensure that each point in space has a unique time-varying function the exponents of $iG_x(t), G_y(t)$ and $G_z(t)$ are made independent functions. To isolate a specific region at x=a, y=b, z=c each period of v(t) is multiplied by $\exp\{-i\gamma\tau[G_x(nT)a + G_y(nT)b + G_z(nT)c]\}$ and followed by integration. A representative set of functions are sinusoids of different frequencies, $\omega_x, \omega_y$ and $\omega_z$ providing a localization function $J_0(\alpha x)J_0(\alpha y)J_0(\alpha z)$. As before, we can provide an improved localization function by first multiplying v(t) by the function $(1 + e^{-i2n\omega_z t})(1 + e^{-i2n\omega_y t})(1 + e^{-i2n\omega_x t})$ to provide the localization function $$\frac{J_1(\alpha x)}{\alpha x} \frac{J_1(\alpha y)}{\alpha y} \frac{J_1(\alpha z)}{z}.$$

A wide variety of alternate functions can be used for the sampled gradient modulation including other periodic functions and also aperiodic functions such as polynomials. One efficient alternative is the use of two quadrature sinusoids of the same frequency on two axes, such as the x and y axes, and a sinusoid of a different frequency of the third axis. The phase function is then given by $$\theta_n = \gamma\tau \overline{G}(t)[\sin(\omega_1 nT)x + \cos(\omega_1 nT)y + \sin(\omega_2 nT)z]$$

$$= \gamma\tau[r \sin(\omega_1 nT + \theta') + z \sin(\omega_2 nT)]$$

where $r = \sqrt{x^2 + y^2}$ and $\theta' = \tan^{-1} y/x$. As before, for localization at a,b,c each period of v(t) is multiplied by $\exp\{-i\gamma\tau G[a \sin(\omega_1 nT) + b \cos(\omega_1 nT) + c \sin(\omega_2 nT)]\}$. Referring to FIGS. 1 and 2, we first study localization along the x axis only. Waveform 35 is used for the excitation signal $V_4$. This should preferably be a broad band excitation signal which can simultaneously excite the entire volume of interest, independent of the particular gradient condition. FIG. 2 represents a sequence of excitations, each in the presence of a different x gradient signal $V_5$ as shown by waveform 36. We will initially ignore waveform 37, the x gradient signal during reception of the FID signal 31 shown as waveform 38.

As previously indicated, because of the presence of the different gradients $V_5$ during the excitation interval, FID waveform 38 will have different starting phases. Processor 29 in FIG. 1 is used to effectively alter the initial phases and then integrate or low-pass filter, so as to isolate the desired region. A number of approaches for accomplishing this are shown in FIGS. 3a–3d.

In FIG. 3a the received signal 31 is first stored in storage system 43 for subsequent processing. This can be a standard digital store such as a core or solid state memory or a mechanical system such as a disk or tape unit. The stored signal is applied to controlled phase shift unit 40, which, as previously described, phase shifts the received signal following each excitation. The phase shifter is controlled by excitation clock 41 which times the excitation sequence. A particular position is dialed in using position selector 42 which determines how much phase shift is applied. As indicated, the required phase shift is a function of position in space. The controlled phase shifter 40 can be a linear circuit using electrically controlled capacitors, inductors or resistors. Alternatively it can be an electrically controlled capacitors, inductors or resistors. Alternatively it can be an electrically variable delay line. Other approaches include CCD devices or bucket brigade systems whose delay depends on clock frequency. In these latter cases position selector 42 would vary the clock frequency for a period of time to shift the phase.

The phase shifted signal is demodulated in the usual way using sine and cosine demodulators 44 and 45 which multiply the signal by sin $\omega_0 t$ and cos $\omega_0 t$, followed by integrators 49 which average the demodulated signal over a number of excitation cycles. Integrators 49 can be low-pass electrical filters, such as RC circuits, or digital integrators. The two integrated outputs are combined in combiner 46 in a number of ways. In one approach the real part only, from the cosine demodulator, can be used. Alternatively combiner 46 can provide the magnitude by taking the square root of the sum of the squares of both integrated outputs. The output of combiner 46, 33, represents a specific output pixel in display 33. Assuming the display 33 has an associated circulating storage system, this pixel can be stored while position selector 42 is sequenced through different phase sequences representing different pixels until a complete image 30 is formed.

An alternate approach to processor 29 is shown in 3b. It makes use of the fact that the output of a synchronous demodulator is determined by the relative phase between the incoming signal and the multiplying or sampling signal. In FIG. 3b sampling generators 47 and 48 nominally represent the sin $\omega_0 t$ and cos $\omega_0 t$ demodulation signal generators. The phase of these generators is altered following each excitation. Again the timing of the excitation is determined by 41 and the amount of phase shift by 42. The phase shift can be accomplished by a controlled monostable multivibrator, a digital shift register, or by any of the methods previously described. The demodulators 44 and 45, integrator 49 and combiner 46 operate as previously described.

A similar approach is shown in FIG. 3c where the phase shift is applied using a heterodyne mixer 50 and heterodyne signal generator 51 which heterodynes the incoming signal to a new frequency represented by the difference of the two frequencies. The phase shift is conveniently applied to signal generator 51 by any of the previously described techniques or other well-known methods. Again the phase shift is initiated by clock 41 and the specific amount for the desired region inserted in 42. Following phase shift in mixer 50 the signal can be demodulated in conventional fashion by demodulation system 52 which can represent the same system as in FIG. 3a following controlled phase shifter 40.

A fourth approach is shown in FIG. 3d. Here we make use of the fact that a phase shifter $e^{i\theta}$ can be replaced by multiplying the real part by cos $\theta$ and the imaginary part by sin $\theta$. As before, the incoming signal 31 is stored in 43 where it is subsequently demodulated in 44 and 45 using sin $\omega_0 t$ and cos $\omega_0 t$. Following demodulation, after each excitation, the output of demodulator 45 is multiplied by cos $\theta$ in multiplier 56 and the output of demodulator 44 is multiplied by sin $\theta$ in multiplier 55. Again $\theta$ is determined, as previously described, by the initial phase shift corresponding to a specific region in space. These signals are again followed by integrators 49 and combiner 46 to provide the output to display 33.

In the foregoing description, each local region has been isolated using operations directly on the received signal. In some instances, for computational efficiency, it is preferable to operate on the Fourier transform of the signal where the operations are performed in the frequency domain. In the time domain the received signal 31 is multiplied by a sequence of phase shifts following each excitation, with the result integrated. In the frequency domain this corresponds to the transform of the received signal convolved with the transform of the sequence of phase shifts with the result subject to narrow-band filtering as shown in FIG. 4.

Here a digital Fourier transform is taken in structure 60. This may include a demodulator to get the signal down to baseband to facilitate taking the transform. The Fourier transform is then convolved with a function based on the region or pixel being selected. As shown in FIG. 4, 61 is a digital convolver. The particular function selected is based on the desired pixel information coming from 42 and the excitation clock 41. As shown in FIG. 4, a number of pixels can be derived simultaneously where each transform of the sequence of phase shifts corresponds to a different region or pixel. The convolvers are each followed by narrow-band filter 62 to extract the carrier or low frequency component. The pixel values 33 are then sent to the display.

In those cases where the phase function $\theta(nT)$ is periodic, such as the sinusoidal gradient signal during excitation previously described, both the transform of the received signal, and the transform of the sequence of phase shifts, are both arrays of very narrow band functions approaching delta functions. The convolution of two sets of delta functions produces another set of delta functions. The narrow band filtering merely selects the center narrow band function, following convolution. Convolution, followed by selection of one spectral island, is the equivalent of taking a weighted sum of the components of the incoming signal, as indicated in the previously referenced application Ser. No. 603,333 now U.S. Pat. No. 4,639,671. FIG. 5 illustrates an alternate processing system 29 where the initial phase function is periodic. First a Fourier transform is taken in DFT structure 60. Because of the periodically time-varying gradient during the excitation interval, the spectrum of 31 is an array of narrow band spectra. Thus the output continuous grating signal forms a received signal from each point given by $$v(t) = \sum_{n=0}^{N-1} e^{i\theta_n} e^{-(t-nT)/T_2} \text{rect} \frac{t - \frac{T}{2} - nT}{T} \exp\left[-i\gamma Gx \int_{nT}^{t} \sin\omega t \, dt\right]$$

where $\theta_n = \gamma \tau G x \sin(\omega nT)$.

$$v(t) = \sum_l J_l(\alpha x) \sum_{n=0}^{N-1} e^{il n\omega T} e^{-(t-nT)/T_2} \text{rect} \frac{t - \frac{T}{2} - nT}{T} e^{-i\frac{\gamma Gx}{\omega}\cos(\omega t)} \times e^{-i\frac{\gamma Gx}{\omega}\cos(\omega nT)}$$

$$v(t) = \sum_l J_l(x\sqrt{\alpha^2 + \beta^2}) \sum_p (i)^p J_p(\beta x) \sum_{n=0}^{N-1} e^{il(\omega nT+\psi)} e^{ip\omega t} e^{-(t-nT)/T_2} \text{rect} \frac{t - \frac{T}{2} - nT}{T}$$

of 60 is an array of amplitudes representing the transform. To isolate a specific point in space, sets of weights such as 65, 66 and 67 are applied to the signal spectra. Each of these represent those required by the effective convolution of the two spectra, followed by filtering of the center carrier component. Following the weightings, each of the spectral components are summed in adders 64. Although three are shown for convenience, clearly this can include all of the pixels involved. Alternatively, the signal 31 can again be stored and an array of pixels can be processed, as in FIG. 5, with the process repeated a number of times, each time changing the weights in 65–67 and equivalent weighting structures. This parallelism can also be applied to the previously shown system in FIG. 3 where many pixels are acquired simultaneously.

It should be emphasized that the previous expression for $\theta$, the relative phase shift, assumed that the phase shift was proportional to the product of the gradient amplitude and the distance from the origin. This is reasonably accurate for relatively small tip angles, of the order of 30° or less. For larger tip angles of 90°, or the 180° used in obtaining spin echoes, the relative phase $\theta$ becomes nonlinear so that it will not be linearly related to position. However, for a known excitation and a known gradient, $\theta$ vs. position is a known function. Therefore, at each position in space, the approximate $\theta$ is determined as given by $$\theta = f[G(t) \cdot r]$$

where f is the nonlinear function relationship, derived from the Bloch equations, and G is the gradient amplitude during the excitation interval. Knowing $\theta$ at each desired position allows us to incorporate it into position selector 42 in the various signal processing embodiments.

We have thusfar discussed novel systems where time-varying gradients during the excitation interval are used to isolate each point in a volume. An alternate approach, making use of the same basic system, is to combine time-varying gradients during excitation with time-varying and static gradients during the receiving portions of the cycle. For example, we first consider the simple one-dimensional case where a sinusoidal gradient signal runs continuously, thus providing both a time-varying excitation gradient and a time-varying receiving gradient. This case is of particular interest in efficient resonant gradient systems where the sinusoidal gradient signal runs continuously, enabling the use of an efficient low-current gradient coil with many turns. A where $$\beta = \frac{\lambda G}{\omega} \text{ and } \psi = \tan^{-1}\frac{\beta}{\alpha}.$$

To provide the desired localized signal we can take a sum of integrals of each period T, and extract the real part to obtain $$\int_0^{NT} v(t) =$$

$$\sum_l J_l(x\sqrt{\alpha^2 + \beta^2}) \sum_p (i)^p J_p(\beta x) \sum_{n=0}^{N-1} e^{il(\omega nT + \psi)} \frac{e^{nTip\omega}(T^2 ip\omega + T_2)}{1 + (p\omega T_2)^2}$$

For $\omega T_2 \gg 1$, as represented by having a number of gradient cycles in each decay interval, all terms other than p=0 are attenuated. Also, for sufficiently large N, as previously indicated, the sum of $\exp[il(\omega nT+\psi)]$ will be zero except for l=0. We therefore are left with a localization function $$\int_0^{NT} v(t) = N J_0(x\sqrt{\alpha^2 + \beta^2}) J_0(\beta x) T_2$$

To further improve this function, as before, we multiply each period of v(t) by $\{1+\exp[-i2(\omega t+\omega nT+\psi)]\}$ to add the $J_2$ components. Following integration we have $$\int_0^{NT} v(t) = N \frac{J_1(x\sqrt{\alpha^2 + \beta^2})}{x\sqrt{\alpha^2 + \beta^2}} \frac{J_1(\beta x)}{\beta x} T_2$$

which is a significantly improved localization function.

Again, as before, to use the system to isolate any desired point we premultiply v(t) by $$\exp\left[i\frac{\gamma Ga}{\omega}\cos\omega t\right]$$

and multiply each period by $$\exp\left\{-i\gamma Ga\left[\tau\sin(\omega nT) + \frac{1}{\omega}\cos(\omega nT)\right]\right\}$$

to provide the localization at x=a.

In addition to providing a desired localization function at any desired point, this approach has the added desirable characteristic that the gradient signal is a continuous sinusoid which is uninterrupted through the excitation interval and the receiving interval. Therefore high Q gradient coils can be used with many turns and low currents, thus simplifying the gradient problems and enabling the use of relatively high gradient fields for improved spatial resolution.

In a general sense, we have a repetitive series of excitations which result in a sequence of signals having an initial phase shift which is spatially dependent and a continuous phase modulation component which is spatially dependent. To decode any point in space we multiply the received signal by a complimentary function having compensating initial phase shifts and compensating phase modulation during reception for the desired point. This is followed by a temporal integration or low pass filtering following demodulation, or band-pass filtering around the carrier prior to demodulation.

It is significant to note that, even if no varying gradients are used during the excitation interval, the processing systems of FIGS. 3–5 can be used to advantage. When time-varying gradients during reception only are used, they can result in a varying initial phase shift as shown in the previous equations where the term $$\exp\left[i\frac{\gamma Gx}{\omega}\cos\omega nT\right]$$

was the initial phase shift. Thus the processing portion of the invention, compensating for initial phase variations, can be used in a more general way.

FIG. 2 illustrates the systems including varying gradients during both excitation and reception. Gradient waveform $V_5$ illustrates the excitation portion 36 and the reception portion 37. This represent a continuous sine wave where the short excitation portion 36 is approximately constant. Thus if we have a series of excitations which are not synchronous with the sinusoidal gradient waveform, and the gradient runs continuously, the system will experience a sinusoidally varying excitation gradient 36 and a sinusoidally varying reception gradient 37 during the received signal 38.

FIG. 2 can also represent the multidimensional imaging systems. The gradient waveform $V_5$ in x direction can also represent gradient $V_2$ in the z direction and $V_3$ in the y direction. In each case these will be orthogonal sinusoids, either of different frequencies or, with two of one frequency and quadrature phases, with the third of a different frequency.

The arrangement with quadrature phases is attractive since it requires only one frequency for a planar image, and two frequencies for acquiring data from the entire volume. Continuous sine and cosine signals are used on two of the gradients such as the x and y axis. In the radial direction, as before, we achieve a localization function of the form $J_0(r\sqrt{\alpha^2+\beta^2})J_0(\beta r)K$. Again, for improved resolution or localization, we multiply by $1+\exp[-2i(\omega t+\omega nT+\psi)]$ to obtain $$\frac{J_1(r\sqrt{\alpha^2+\beta^2})}{(r\sqrt{\alpha^2+\beta^2})}\frac{J_1(\beta r)}{\beta r}.$$

To localize at point x=a, y=b each signal is phase shifted by multiplying by $\exp\{-i\sqrt{\alpha^2+\beta^2}\}[a\sin(\omega nT+\psi)+b\cos(\omega nT+\psi)]\}$ and the continuous received signal is multiplied by $\exp\{i[\beta a\cos\omega t+\beta b\sin\omega t]\}$.

All of the processing systems shown can be used for the various alternative embodiments shown including time-varying gradients during reception, multidimensions, and improved localization functions. This is accomplished, as discussed, by appropriately altering the position selection system 42. In those cases where the varying gradients are used only during the excitation interval, as in 36 in FIG. 1, the control function results in a sequence of compensating phase shifts for each region. In those cases where, in addition, time-varying gradients are used during the reception interval, the various basic processing systems can continue to be used.

As previously indicated, the entire volume can be excited by the rf pulse $V_4$. Alternatively, a single plane can be imaged by the use of a narrow band excitation signal in the presence of a static gradient normal to the plane of interest. Thus only the plane of interest is excited. For example, a pulse $V_2$ can be applied during rf excitation 35 to confine the imaging to a plane, such as plane 28 in FIG. 1. Time-varying gradients are used in $V_3$ and $V_5$ to provide a cross-sectional image of plane 28. These can be of different frequencies or of quadrature phase of the same frequency.

In any of the volumetric imaging systems described a wideband rf burst 35 is used in an effort to uniformly excite the entire volume under all gradient conditions. In some cases, some degree of non-uniform excitation can occur. This can be compensated for by weighting the phase corrected signals prior to summation or, following reconstruction, by appropriately modifying the amplitudes of the reconstructed values. This compensation requirement can be minimized by using excitations, such as short pulses or adiabatic fast passage, which provide uniform excitation independent of the gradient conditions.

This same basic approach to providing phase compensation for each point in space can be utilized for any excitation system including spin echoes, driven equilibrium or steady state free precession. In each case the amount of resulting phase shift for each point in space, for each gradient amplitude is pre-calculated or measured and used to provide the appropriate compensation as shown in FIGS. 3, 4 and 5.

One of the major strengths of this imaging approach, as with previously described time-varying gradient systems is their immunity to inhomogeneity and chemical shift. In existing commercial magnetic resonance imaging systems, chemical shift and inhomogeneity cause geometric errors and distortion. With this system, however, the geometric position is determined solely by the gradients, and is not distorted or shifted by inhomogeneity or chemical shift. One approach to this problem is the use of low pass filters instead of integrators following demodulation, and then detecting the magnitude of the resultant signal. The filter should be wide enough to include the shifted signal, yet sufficiently narrow to exclude the first sideband at the gradient modulation frequencies. The resultant magnitude will then be immune to shifts due to inhomogeneity or chemical shift. Alternatively a band pass filter can be placed at the carrier frequency followed by an envelope detector.

Instead of measuring the magnitude, to provide the desired image, the resultant frequency distribution, in the vicinity of the carrier, can be used for spectroscopy. Individual frequency components can each be detected or the spectrum can be provided by taking a Fourier transform of the spectrum in the vicinity of the carrier, either before or after demodulation.

A variety of excitation sequences can be used to enable the resultant signal to have various sensitivities to the relaxation times. If the detected FID is integrated, the output is proportional to both density and $T_2$. If the FID is filtered, to isolate the desired point, and then peak detected, it will be sensitive primarily to density. If the recovery from the previous excitation is incomplete, it will have increased sensitivity to $T_1$. In addition, the standard sequences, including inversion recovery for $T_1$ sensitivity and spin echo for $T_2$ sensitivity can be applied to this system of time varying gradients during the excitation and/or receiving intervals with phase compensation.

One important imaging application is angiography or vessel imaging. In NMR, rather than using contrast agents, the blood velocity itself enables the isolation of vessels from static tissue. In U.S. application Ser. No. 332,925 now U.S. Pat. No. 4,528,985 and U.S. application Ser. No. 466,969 now U.S. Pat. No. 4,565,968 by the same inventor projection imaging of vessels were disclosed. Some of the basic methods of vessel imaging introduced in Ser. No. 332,925 can be used to advantage in this invention such as temporal subtraction.

In temporal subtraction we take differences of images taken at different velocities, such as by appropriate timing to an ECG signal. For example, in the system of FIGS. 1 and 2, one image can be created with burst timed to a high velocity portion of the heart cycle, with another obtained at a lower velocity portion. These resultant images are subtracted to provide the isolated vessel image.

What is claimed is:

1. In a method for imaging the magnetic resonance activity of an object the steps of:
   exciting the object with a sequence of rf magnetic excitations in the present of a time-varying magnetic gradient field, each excitation having a gradient field that is different from the gradient fields for other excitations;
   receiving a sequence of signals resulting from said excitations; and
   processing the received signals to map the magnetic resonance activity at a plurality of regions of the object defined by the interaction of rf excitations and the gradient field including cancelling the phase variation caused by the time-varying gradient field corresponding to a region of the object.

2. The method as in claim 1 where the step of cancelling the phase variation includes the step of phase-shifting the received signals following each excitation an amount dependent on the region of the object being imaged.

3. The method as in claim 1 where the step of cancelling the phase variations includes the step of demodulating the received signals and phase shifting the demodulating signals following each excitation an amount dependent on the region of the object being imaged.

4. The method as in claim 1 where the step of cancelling the phase variations includes the step of demodulating the received signal using sine and cosine demodulators and amplitude modulating the output of each demodulator by factors dependent on the region of the object being imaged.

5. The method as in claim 1 where the step of processing the received signal includes the step of Fourier transforming the received signal and convolving the resultant spectrum with the transform of a sequence of phase shifted signals where the phase shift is dependent on the region of the object being imaged.

6. The method as in claim 1 where the step of processing the received signal includes the steps of Fourier transforming the received signal into components of a spectrum, weighting the components of the spectrum with weights dependent on the region of the object being imaged and summing the weighted components.

7. The method as in claim 1 including the step of multiplying the received signal by a sequence of phase shifts corresponding to a harmonic of the time-varying signal to obtain a resultant signal and using the resultant signal to provide a better defined localization function.

8. In a method for processing a received magnetic resonance signal resulting from repeated radio frequency excitations of an object in the presence of a magnetic field to produce an image of the object the steps of:
   compensating for the initial phase variations of the received magnetic resonance signal following each radio frequency excitation for each region of the object being imaged; and
   summing the compensated signals.

9. In a method for imaging the magnetic resonance activity of an object the steps of:
   applying time-varying gradient magnetic fields to said object;
   exciting the object with a sequence of rf magnetic excitations;
   receiving the resultant signals from the sequence of excitations;
   cancelling the initial phase shift following each excitation corresponding to a region of the object;
   multiplying the received signal by a waveform corresponding to the gradient signal; and
   filtering the resultant signal.

10. Apparatus for imaging the magnetic resonance activity of an object comprising:
    means for exciting the object with a sequence of rf magnetic excitations in the present of a time-varying magnetic gradient field, each excitation having a gradient field that is different from the gradient fields for other excitations;
    means for receiving a sequence of signals following the excitations; and
    means for processing the received signals to map the magnetic resonance activity at a plurality of regions of the object including cancelling the phase shift caused by the time-varying gradient field corresponding to a region of the object.

11. Apparatus as described in claim 10 where the means for cancelling the phase variation includes means for phase-shifting the received signals following each excitation an amount dependent on the region of the object being imaged.

12. Apparatus as described in claim 10 where the means for cancelling the phase variations includes means for demodulating the received signals and means for phase shifting the demodulation signals following each excitation an amount dependent on the region of the object being imaged.

13. Apparatus as described in claim 10 where the means for cancelling the phase variations includes means for demodulating the received signal using sine and cosine demodulators and means for amplitude modulating the output of each demodulator by factors dependent on the region of the object being imaged.

14. Apparatus as described in claim 10 where the means for processing the received signal includes means for Fourier transforming the received signal and means for convolving the resultant spectrum with the transform of a sequence of phase shifted signals where the phase shift is dependent on the region of the object being imaged.

15. Apparatus as described in claim 10 where the means for processing the received signal includes:
   means for Fourier transforming the received signal;
   means for weighting the components of the spectrum with weights dependent on the region of the object being imaged; and
   means for summing the weighted components.

16. Apparatus as described in claim 10 including means for multiplying the received signal by a sequence of phase shifts corresponding to a harmonic of the time-varying signal and means for processing the resultant signal to provide a better defined localization function.

17. Apparatus as described in claim 10 including means for applying a time-varying gradient signal during the time that signals are received.

18. Apparatus as described in claim 17 where the time-varying gradient is a continuous sinusoidal signal providing a time-varying gradient during the excitation and reception times.

19. Apparatus as described in claim 18 using a gradient circuit which is resonant at the sinusoidal frequency.

20. Apparatus as described in claim 10 including means for applying different gradient signals to each coordinate.

21. Apparatus as described in claim 20 where the different signals are sinusoids of different frequencies which are not harmonically related.

22. Apparatus as described in claim 20 where two of the coordinates have sinusoidal gradient signals of the same frequency which are of different phases.

23. Apparatus as described in claim 10 where the object includes blood vessels and including means for exciting the object at times corresponding to different blood velocities and means for subtracting the resultant images corresponding to different velocities whereby images are formed of blood vessels only.

* * * * *